United States Patent
Mehrotra et al.

(10) Patent No.: US 7,611,939 B2
(45) Date of Patent: Nov. 3, 2009

(54) SEMICONDUCTOR DEVICE MANUFACTURED USING A LAMINATED STRESS LAYER

(75) Inventors: Manoj Mehrotra, Plano, TX (US); Antonio L. P. Rotondaro, Dallas, TX (US); Puneet Kohli, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 11/745,044

(22) Filed: May 7, 2007

(65) Prior Publication Data
US 2008/0277730 A1    Nov. 13, 2008

(51) Int. Cl.
*H01L 21/8238*    (2006.01)
(52) U.S. Cl. .................. 438/199; 257/E21.633
(58) Field of Classification Search .................. None
See application file for complete search history.

(56) References Cited

U.S. PATENT DOCUMENTS

| | | | |
|---|---|---|---|
| 6,982,196 B2 * | 1/2006 | Belyansky et al. | 438/199 |
| 7,009,226 B1 * | 3/2006 | Sun | 257/192 |
| 7,053,400 B2 * | 5/2006 | Sun et al. | 257/19 |
| 2003/0032306 A1 * | 2/2003 | Conti et al. | 438/778 |
| 2005/0118770 A1 * | 6/2005 | Nandakumar et al. | 438/305 |
| 2005/0263825 A1 * | 12/2005 | Frohberg et al. | 257/369 |
| 2006/0024873 A1 * | 2/2006 | Nandakumar et al. | 438/197 |
| 2006/0269693 A1 * | 11/2006 | Balseanu et al. | 427/569 |
| 2007/0105299 A1 * | 5/2007 | Fang et al. | 438/199 |
| 2007/0141775 A1 * | 6/2007 | Teo et al. | 438/231 |

* cited by examiner

*Primary Examiner*—Sue Purvis
*Assistant Examiner*—Benjamin P Sandvik
(74) *Attorney, Agent, or Firm*—Warren L. Franz; Wade J. Brady, III; Frederick J. Telecky, Jr.

(57) ABSTRACT

There is presented a method of forming a semiconductor device. The method comprises forming gate structures including forming gate electrodes over a semiconductor substrate and forming spacers adjacent the gate electrodes. Source/drains are formed adjacent the gate structures, and a laminated stress layer is formed over the gate structure and the semiconductor substrate. The formation of the laminated stress layer includes cycling a deposition process to form a first stress layer over the gate structures and the semiconductor substrate and at least a second stress layer over the first stress layer. After the laminated layer is formed, it is subjected to an anneal process conducted at a temperature of about 900° C. or greater.

15 Claims, 6 Drawing Sheets

SEMICONDUCTOR DEVICE MANUFACTURED USING A LAMINATED STRESS LAYER

TECHNICAL FIELD

The invention and the embodiments discussed herein are directed in general to a semiconductor device, and more specifically to a semiconductor device manufactured using a laminated stress layer.

BACKGROUND

In the continuing effort to improve performance of transistors and integrated circuits (ICs) in which they are used, semiconductor device designers strive to increase the drive current of the devices to increase switching speeds and overall performance. One aspect of this effort includes incorporating stress into the channel region of the device.

However, as overall device size has decreased, problems associated with the manufacturing processes used to accomplish increased drive current have arisen. For example, in typical processes, a relatively thick (800 angstroms to 1000 angstroms) stress inducing layer is deposited over the gate electrode structures. A thick layer is used because more stress can be incorporated into the channel by utilizing a thick layer of material, which allows for a greater increase in drive current. However, when these thick layers are annealed, they can often provide a torque stress on the gate electrode, thereby causing a portion of the gate electrode to crack and break off. This, of course, is unacceptable as it increases defects across a semiconductor wafer and consequently decreases yields.

Accordingly, what is needed is a method for increasing drive current by stress induction while minimizing damage to the gate electrodes.

SUMMARY

To address the deficiencies as discussed above, the invention, in one embodiment, provides a method of manufacturing a semiconductor device. This particular embodiment comprises forming gate structures including forming gate electrodes over a semiconductor substrate and forming spacers adjacent the gate electrodes. Source/drains are formed adjacent the gate structures, and a laminated stress layer is formed over the gate structure and the semiconductor substrate. The formation of the laminated stress layer includes cycling a deposition process to form a first stress layer over the gate structures and the semiconductor substrate and at least a second stress layer over the first stress layer. This embodiment further includes annealing the laminated stress layer at a temperature of about 900° C. or greater.

In another embodiment, there is provided a method of manufacturing a semiconductor device. This embodiment comprises forming gate structures, including forming gate electrodes over a semiconductor substrate and forming spacers adjacent the gate electrodes. Source/drains are formed adjacent the gate structures, and a laminated silicon nitride stress layer is formed over the gate structures and the source/drains. Its formation includes depositing a first silicon nitride stress layer over the gate electrodes and the semiconductor substrate, pausing the deposition process for a first time, and depositing at least a second silicon nitride stress layer over the first silicon nitride stress layer subsequent to pausing. The laminated silicon nitride stress layer is also annealed at a temperature ranging from about 900° C. to about 1300° C. with a thermal anneal, a laser anneal, or a combination thereof.

In yet another embodiment, there is provided a semiconductor device. In this embodiment, the device comprises transistors that include gate electrodes located over a semiconductor substrate, spacers located adjacent the gate electrodes, and source/drains located adjacent the gate electrodes. An intrinsic stress is added to the device by placing a laminated stress layer over the gate electrodes and annealing the laminated stress layer, wherein the laminated layer has a tensile stress ranging from about 1300 MPa to about 1700 MPa. Dielectric layers are located over the transistors, and interconnects are formed within and over the dielectric layers and configured to connect the transistors to other components.

BRIEF DESCRIPTION OF THE DRAWINGS

Reference is now made to the following descriptions taken in conjunction with the accompanying drawings, in which.

DETAILED DESCRIPTION

The invention recognizes the benefits associated with laminating a stress layer and annealing that layer to incorporate stress into a channel region located under the gate electrodes of semiconductor substrate. The embodiments discussed herein not only achieve more stress than conventional processes, but they also provide the added stress with an overall thinner layer and without creating undue torque on the gate electrodes. As such, this reduces damage to the gate electrodes as compared to conventional processes. Further, the thinner laminated layers are more easily deposited between gate structures that are spaced closely together.

Figure 1:
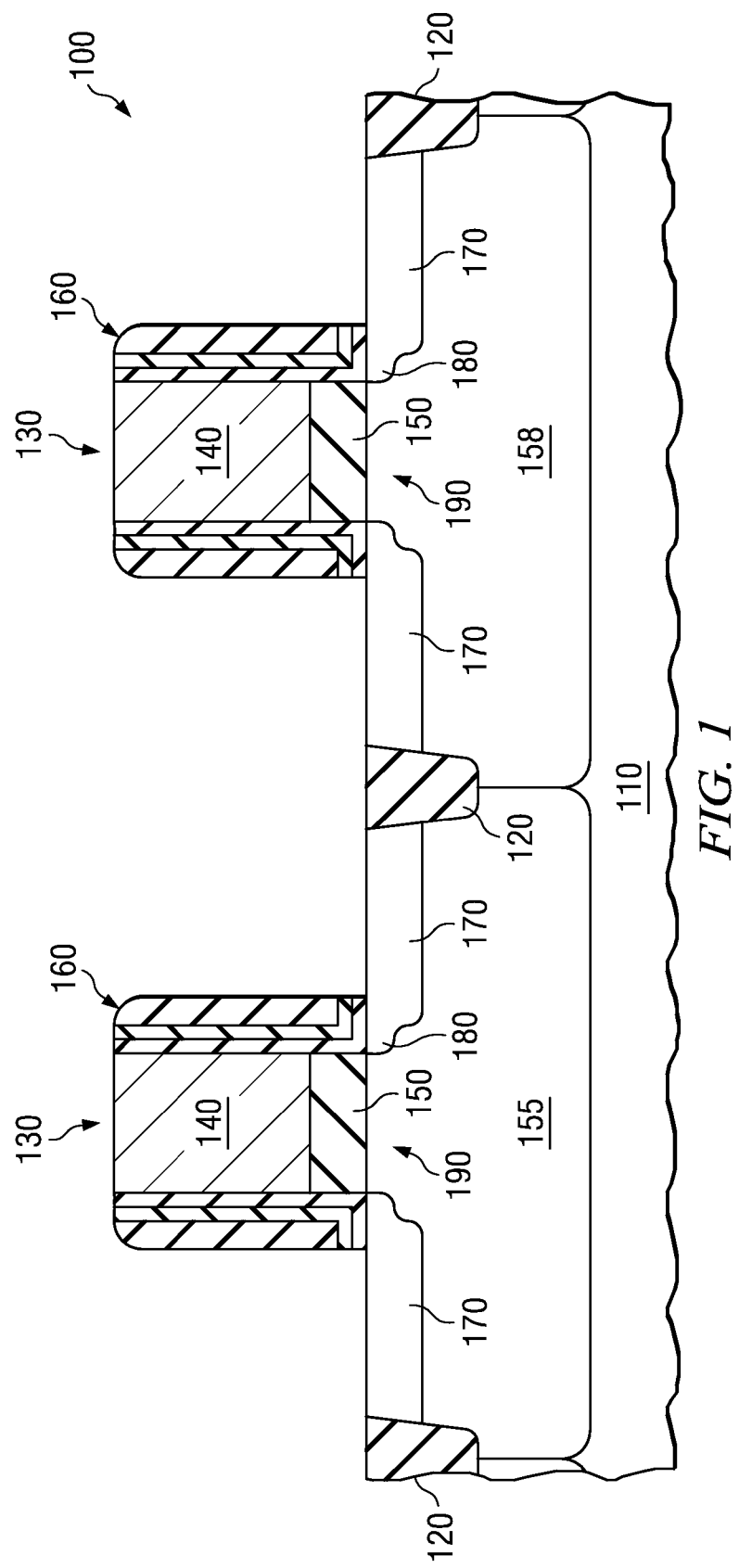
FIGS. 1-4 illustrate a semiconductor device and the formation of a laminated stress layer over gate structures.

FIG. 1 illustrates a semiconductor device 100 as provided by the embodiments discussed herein. Reference is made throughout this discussion to the structural elements of FIG. 1. The device 100 may be a MOS device, such as an nMOS or a pMOS transistor, or it may have both types of devices configured as a CMOS device. The embodiments described herein are not limited to only nMOS or pMOS devices, but are applicable to any submicron device to incorporate stress into the substrate of any submicron active device. The device 100 includes a substrate 110, which may be any layer located over a silicon wafer, such as an epitaxial layer or may be the silicon wafer itself. Isolation structures 120 are located in the substrate 110. Gate structures 130 include a gate electrode 140 and a gate dielectric 150 that isolates the gate structure 130 from wells 155 and 158, respectively. Conventional processes and materials may be used to form these structures.

While the length and width of the gate electrodes 140 in the invention may vary, the embodiments discussed herein are particularly useful in those instances where the gate electrodes 140 present a narrow profile. With overall device sizes shrinking, gate structures 130 have become thinner than in previous generations of semiconductor devices. For example, the gate structures 130, which include the spacers 160, may have a height to gap (between gate structures) ratio that ranges from about 0.9 to about 1.5. The height will be approximately the height of gate electrode 140, and the gap between the spacers 160 will depend on spacer width and other design parameters. The higher the ratio number is, the greater the problem associated with stress related torque.

For reasons discussed more fully below, this narrower profile makes the gate electrodes 140 more susceptible to damage during fabrication processes that are used to incorporate stress into the device 100. Sidewall spacers 160, which may also be conventional, are formed on the sidewalls of the gate structures 130. The device further includes source/drains 170, which may include source/drain extension regions 180. The source/drains 170 and extensions 180 may be formed using conventional dopants and implantation processes. A channel 190, having a stress as provided herein, is located between the source/drains 170. Due to the advantages provided by the embodiments herein, the amount of stress that is incorporated into the channel region 190 is greater for the same device size than the stress achievable using conventional processes and with at least the reduction of stress related torque on the gate.

Figure 2:
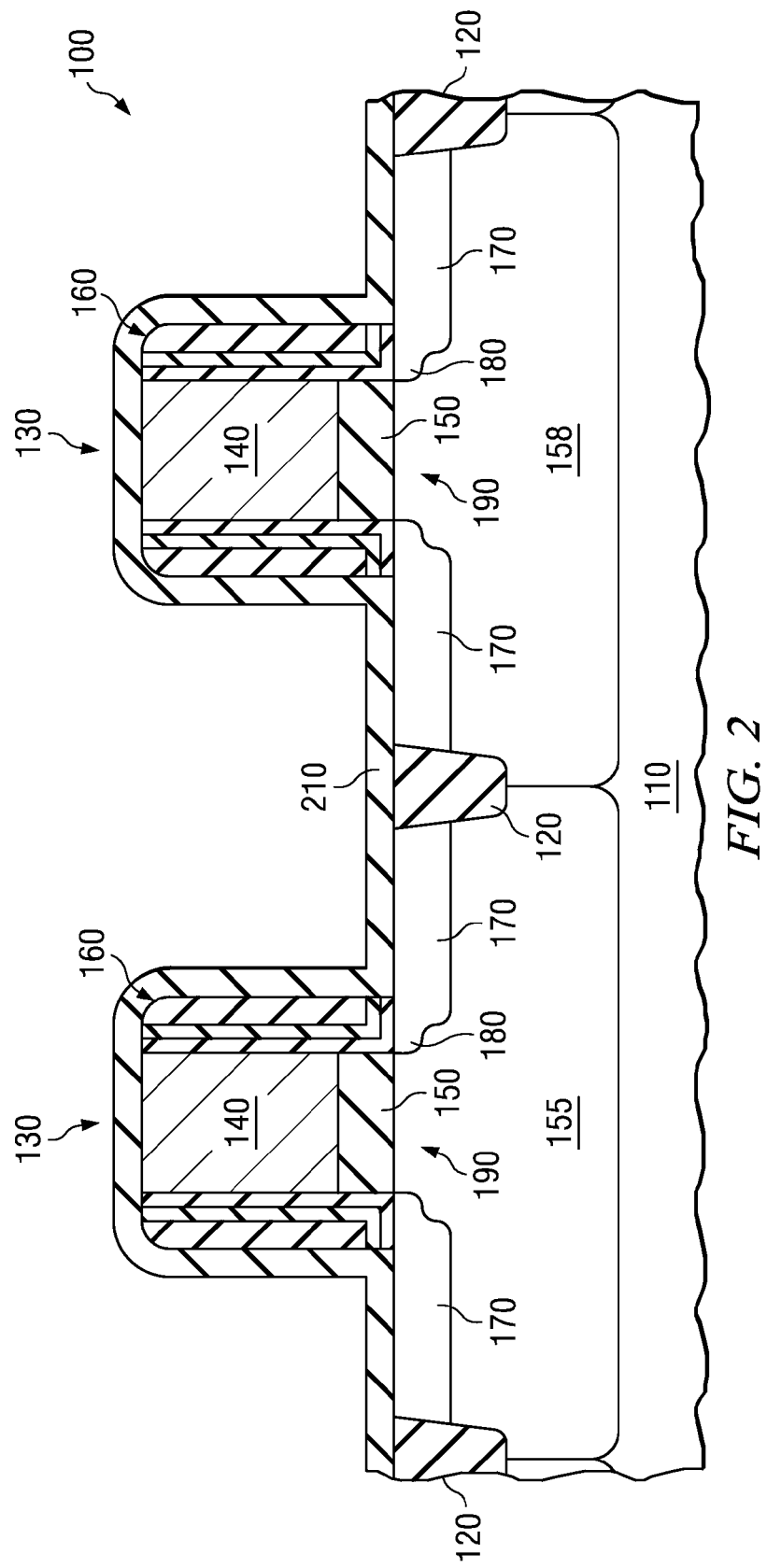

FIG. 2 illustrates the device 100 after the deposition of a first stress layer 210. As used herein a stress layer is one of a multiple number of layers that form a laminated layer (FIG. 4) of material that is used to incorporate stress into the substrate 110, including the channel region 190, upon an annealing process, which, in certain embodiments, can include a UV cure process. The stress layer 210 is the first of several layers that are formed over the gate structures 130 and the adjacent source/drains 170. In one embodiment, the stress layer 210 may be silicon nitride formed by chemical vapor deposition (CVD). It should be understood that the deposition conditions may vary depending on the type of deposition tool being used. However, in one embodiment, $SiH_4$ is flowed at a rate ranging from about 50 sccm to about 700 sccm and either $N_2$ or $NH_3$ is flowed at a rate ranging from about 500 sccm to about 6000 sccm. These gases may be flowed with an inert gas, such as argon or helium at a rate of about 15 liters/sec. The deposition pressure may range from about 1 torr to about 50 torr, and the temperature may range from about 300° C. to about 500° C. Additionally, the lamination or deposition time for the stress layer 210 may range from about 1 second to about 20 seconds, depending on the targeted thickness.

In the illustrated embodiment, the dopants in the source/drains 170 and extensions 180 have not been activated, but after the formation of the laminated stress layer, the anneal used to incorporated stress into the channel 190, in one embodiment, can also be used to activate the dopants. The thickness of the stress layer 210 may vary and will depend on the total thickness of the laminated layer and the number of layers comprising the laminated layer. For example, if the total thickness of the laminated layer is to be 300 angstroms and contain three layers, then the thickness of the stress layer 210 may be 100 angstroms. Alternatively, if the total thickness of the laminated layer is to be 500 angstroms and contain three layers, the thicknesses of each of the layers, including stress layer 210 can be manipulated to achieve the targeted thickness. Theses are but two examples that might be applicable, and any number of layers may be used.

In another embodiment, the stress layer 210 may be a silicon-rich nitride layer which has more silicon than found in a typical silicon nitride. It should be understood that the deposition conditions may vary depending on the type of deposition tool being used. However, in one embodiment, the silicon-rich nitride stress layer may be formed by a plasma enhanced chemical vapor deposition (PECVD). In this embodiment, $SiH_4$ is flowed at a rate ranging from about 15 sccm to about 200 sccm, $N_2$ is flowed at a rate ranging from about 5000 sccm to about 15000 sccm, and $NH_3$ is flowed at a rate ranging from about 50 sccm to about 150 sccm. The pressure may range from about 7 torr to about 50 torr, and the deposition temperature may range from about 350° C. to about 450° C. The radio frequency (RF) power, which may be a single or dual RF power, may range from about 10 watts to about 200 watts. The lamination or deposition time may also vary. For example, it may range from about 1 second to 20 seconds.

Following the deposition of the first stress layer 210, the deposition process is paused such that no significant material is deposited to add to the targeted thickness. In most embodiments, the pause will include discontinuing the deposition process (both gas flows and power) and evacuating the deposition chamber before resuming the deposition process. The pausing and resumption of the deposition process is referred to herein as cycling. In such embodiments, an interface between individual layers most likely will form. In other embodiments, the gas flow rates and power, where applicable, may be substantially decreased such that little to no deposition occurs, or in another embodiment, the gas flows and power may be discontinued altogether before deposition is resumed without chamber evacuation. Without being bound to any theory, it is believed that pausing the deposition process allows the excess surface energy to stabilize and allows the surface atoms and dangling bonds to achieve a relaxed or stable energy state. It is further believed that this relaxation creates stress at the surface of the layer 210.

The amount of time that the deposition process is paused may vary. For example, the deposition may be paused for a period ranging from about 5 seconds to about 5 minutes before the deposition process resumes. Further, the amount of pause time may also be tool dependent. For example, the deposition of one stress layer may occur in one chamber, while the deposition of a subsequent stress layer occurs in a separate chamber. Thus, the pause time would include the time of moving the device 100 from one chamber to the other.

Figure 3:
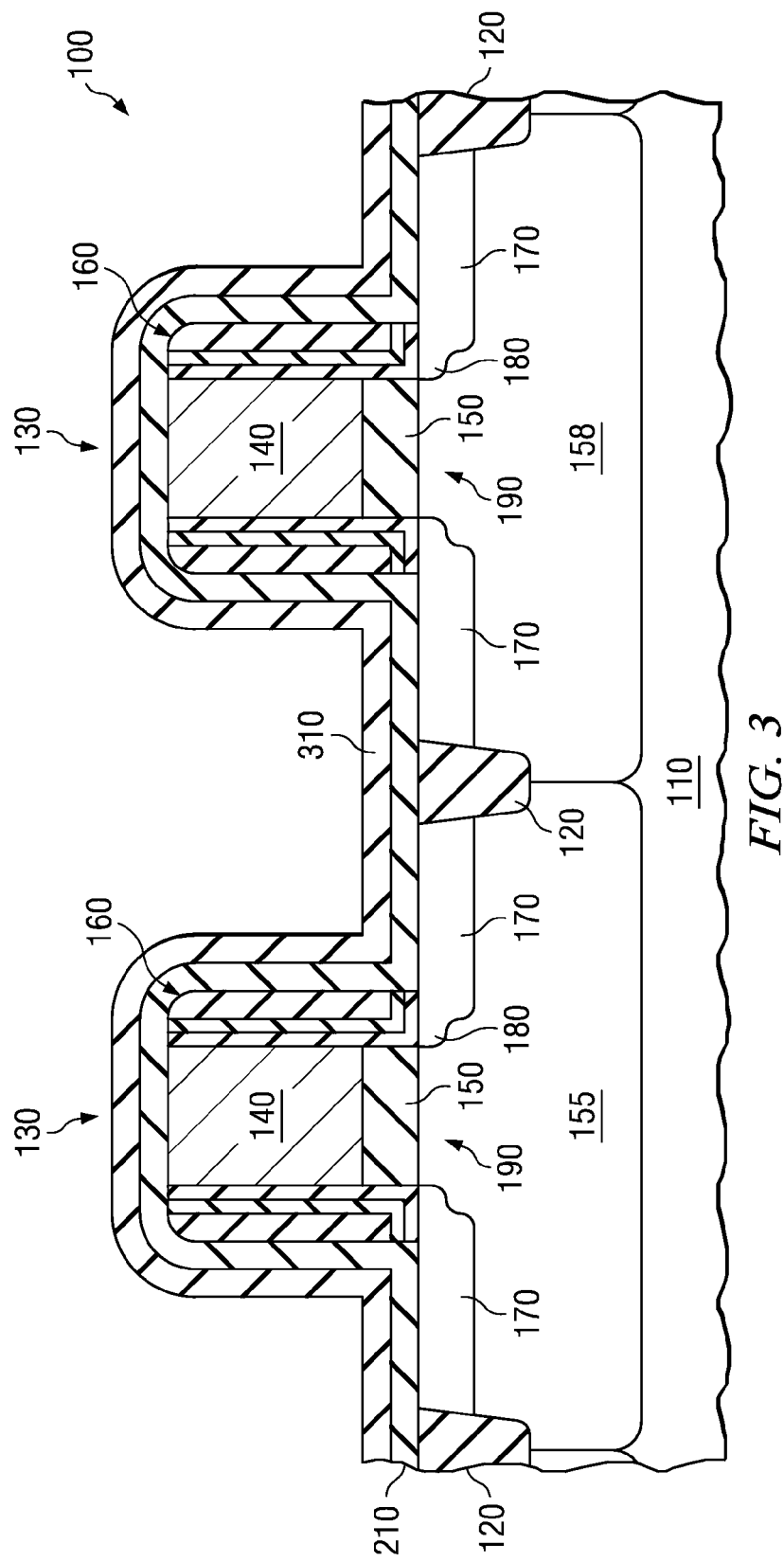

FIG. 3 illustrates the device 100 after formation of a second stress layer 310 over the first stress layer 210. The second stress layer 310 may also be a silicon nitride or a silicon-rich nitride layer, as discussed above. Moreover, it need not be the same material as the first stress layer 210. For example, the first stress layer 210 may be silicon nitride while the second stress layer 310 may be a silicon-rich nitride or vice-versa. In one embodiment, the second stress layer 310 may be located over but directly on the first stress layer 210, or in an alternative embodiment, there could be an intervening layer located between the first and second stress layers 210 and 310. The same processes used to deposit the stress layer 210 may also be used to form the second stress layer 310, depending on whether the stress layer 310 is silicon nitride or silicon-rich nitride. At this point in the fabrication process, no further stress layers may be required, however, in those embodiments where additional stress layers are required, the deposition process is paused, in the manner discussed above, and resumed to form the next stress layer.

Figure 4:
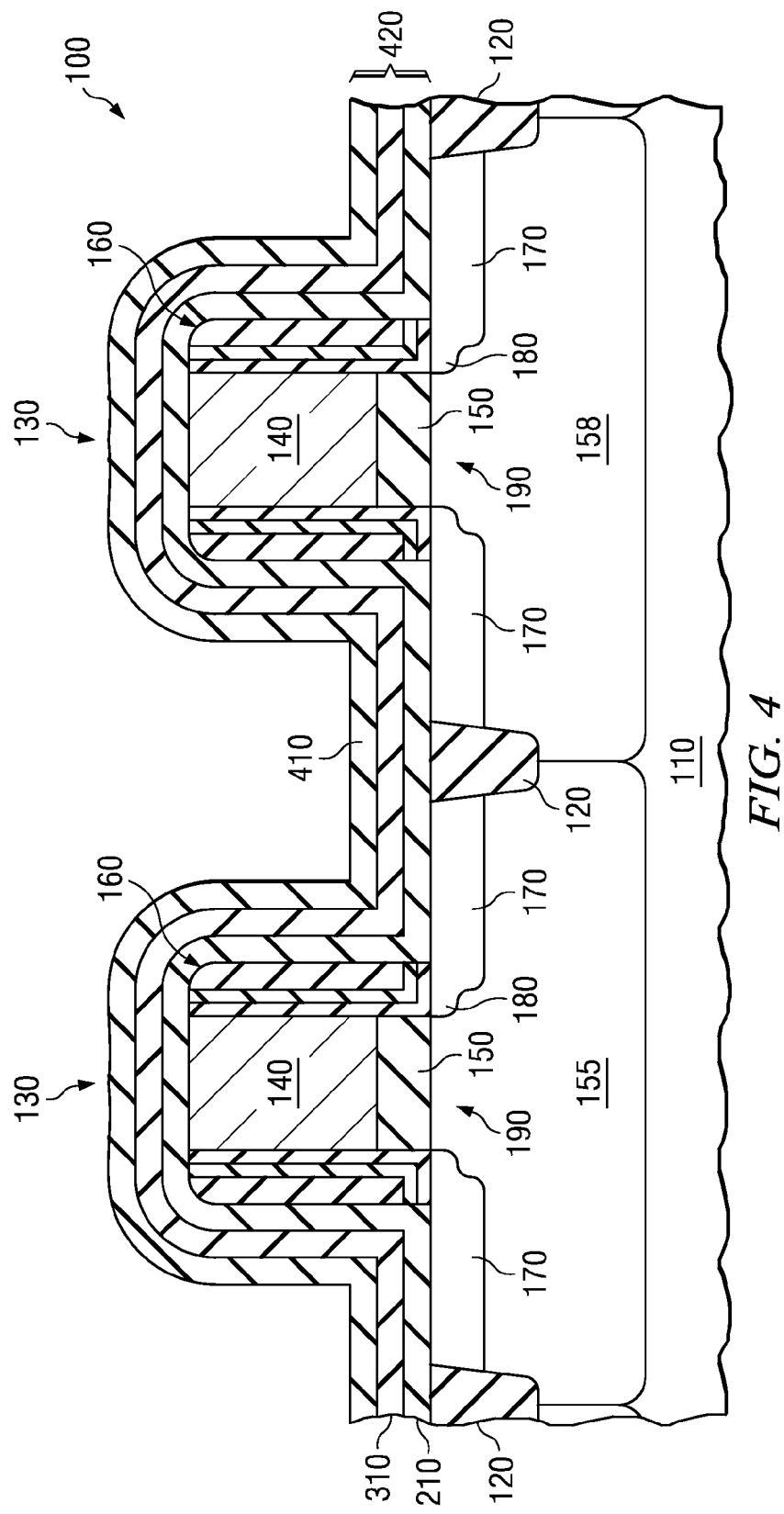

FIG. 4 illustrates the device 100 after formation of a third stress layer 410 over the second stress layer 310 to form a laminated stress layer 420. A laminated stress layer 420 is one that has multiple layers 210, 310, and 410 and has an interface between the layers 210, 310, and 410. The interface, which is shown as the solid lines between stress layers 210, 310, and 410, may be attributable to a difference in material or a discontinuity in stress or density between the various layers 210, 310, and 410. The third stress layer 410 may also be a silicon nitride or a silicon-rich nitride layer, as discussed above. Moreover, it need not be the same material as the second stress layer 310. For example, the third stress layer 410 may be silicon nitride while the second stress layer 310 may be a silicon-rich nitride or vice versa. In one embodiment, the third stress layer 410 may be located over but directly on the second stress layer 310, or there could be an intervening layer located between the second and third stress layers 310 and 410. The same above-discussed processes as used to form the first and second stress layers 210, 310 may also be used to form the third stress layer 410.

In the illustrated embodiment of FIG. 4, the formation of the third stress layer 410 completes the laminated stress layer 420. As mentioned above, the total thickness of the laminated layer 420 will depend on the combined thicknesses of the individual stress layers 210, 310 and 410 and the number of individual layers present. For example, in one embodiment, the laminated layer's 420 thickness may range from 300 angstroms to 600 angstroms and may comprise any number of individual stress layers whose combined thickness equals the targeted thickness of the laminated layer 420. In such embodiments, the deposition process is cycled the appropriate number of times to achieve the desired number of stress layers within the laminated layer 420.

Moreover, the amount of stress that can be incorporated into the channel 190 depends on the number of stress layers that comprise the laminated layer 420; that is, the stress of the individual stress layer 210, 310, and 410 is accumulative. Given this benefit, the amount of stress incorporated into the channel 190 can be easily controlled, thereby allowing for stress optimization of the device 100.

Figure 5:
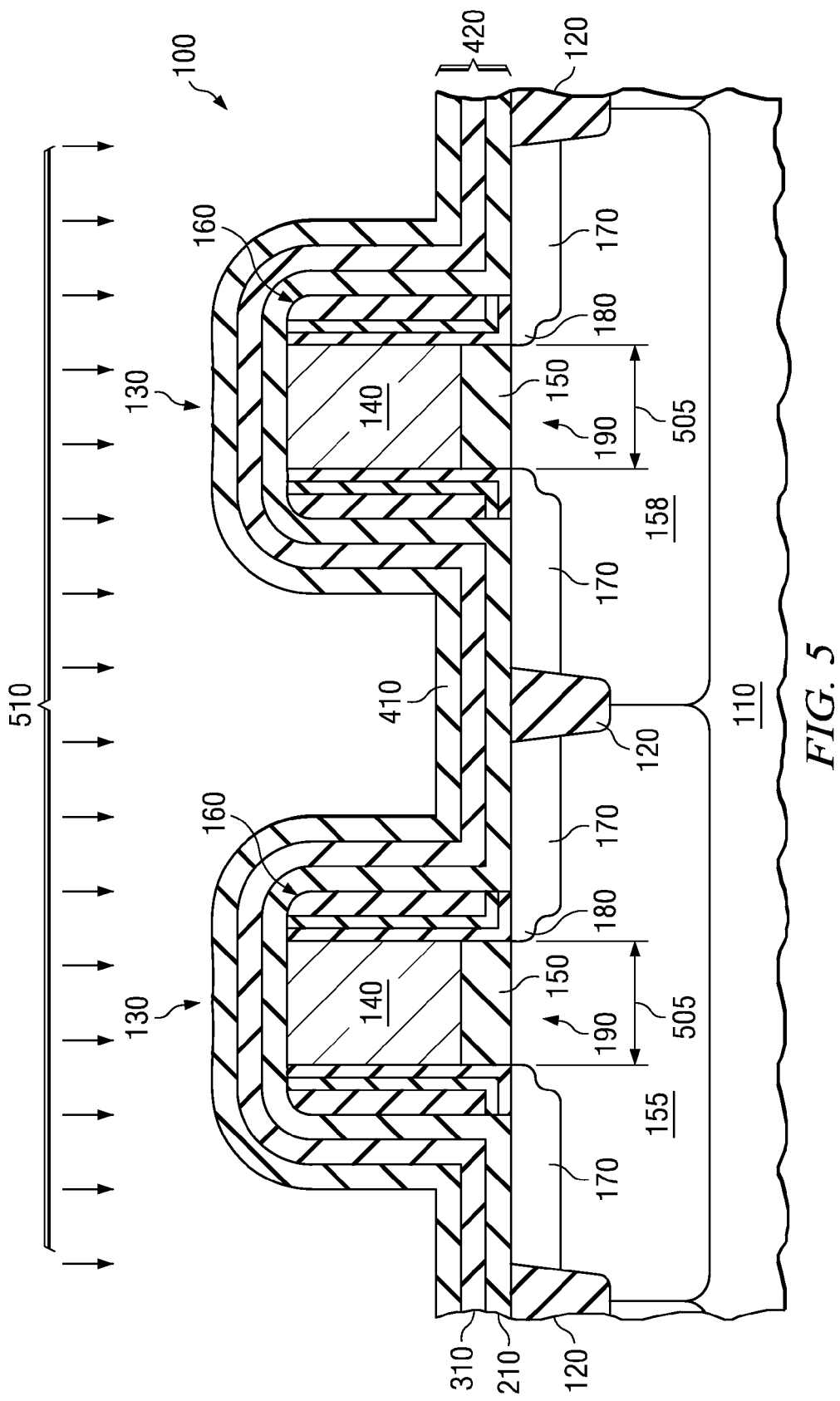
FIG. 5 illustrates an annealing step conducted on the device of FIG. 4.

FIG. 5 illustrates the device 100 of FIG. 4 being subjected to an anneal process 510 that incorporates a stress 505, such as a tensile stress, into the device 100. As such, an intrinsic stress is added to the device 100 by annealing the laminated layer 420, wherein the laminated layer 420 has a tensile stress ranging from about 1300 MPa to about 1700 MPa. In one embodiment, a thermal anneal is conducted at a temperature that ranges from about 900° C. to about 1050° C. In another embodiment, the thermal anneal is followed by a laser anneal that is conducted at temperatures ranging from about 1200° C. to about 1300° C. In yet another embodiment, the thermal anneal is conducted with the laser anneal at the previously stated temperatures. The thermal or laser anneals, or combinations thereof, are particularly useful in those embodiments where the stress layers 210, 310, and 410 are SiN. In embodiments wherein at least one of the stress layers 210, 310, and 410 is a silicon-rich nitride layer, the anneals, as just described above, may be preceded by a UV cure anneal. However, in an alternative embodiment, the UV cure anneal may be conducted subsequent to the thermal or laser anneals. The UV cure is beneficial in that it enhances the stress of the silicon-rich nitride layers; that is, it was unexpectedly found that more stress can be incorporated using the UV cure than could be incorporated absent the UV cure. For example, the amount of nitride film stress prior to the UV cure ranges from about 400 MPa to about 600 MPa whereas the stress following the UV cure ranges from about 1300 MPa to about 1700 MPa. It should be understood that the above annealing processes may be used in combination with each other.

Following the anneal or UV cure processes as discussed above, the laminated stress layer 420, in one embodiment, may be re moved with a conventional hot phosphoric acid process. Alternatively, the laminated stress layer 420 may be left in place.

Figure 6:
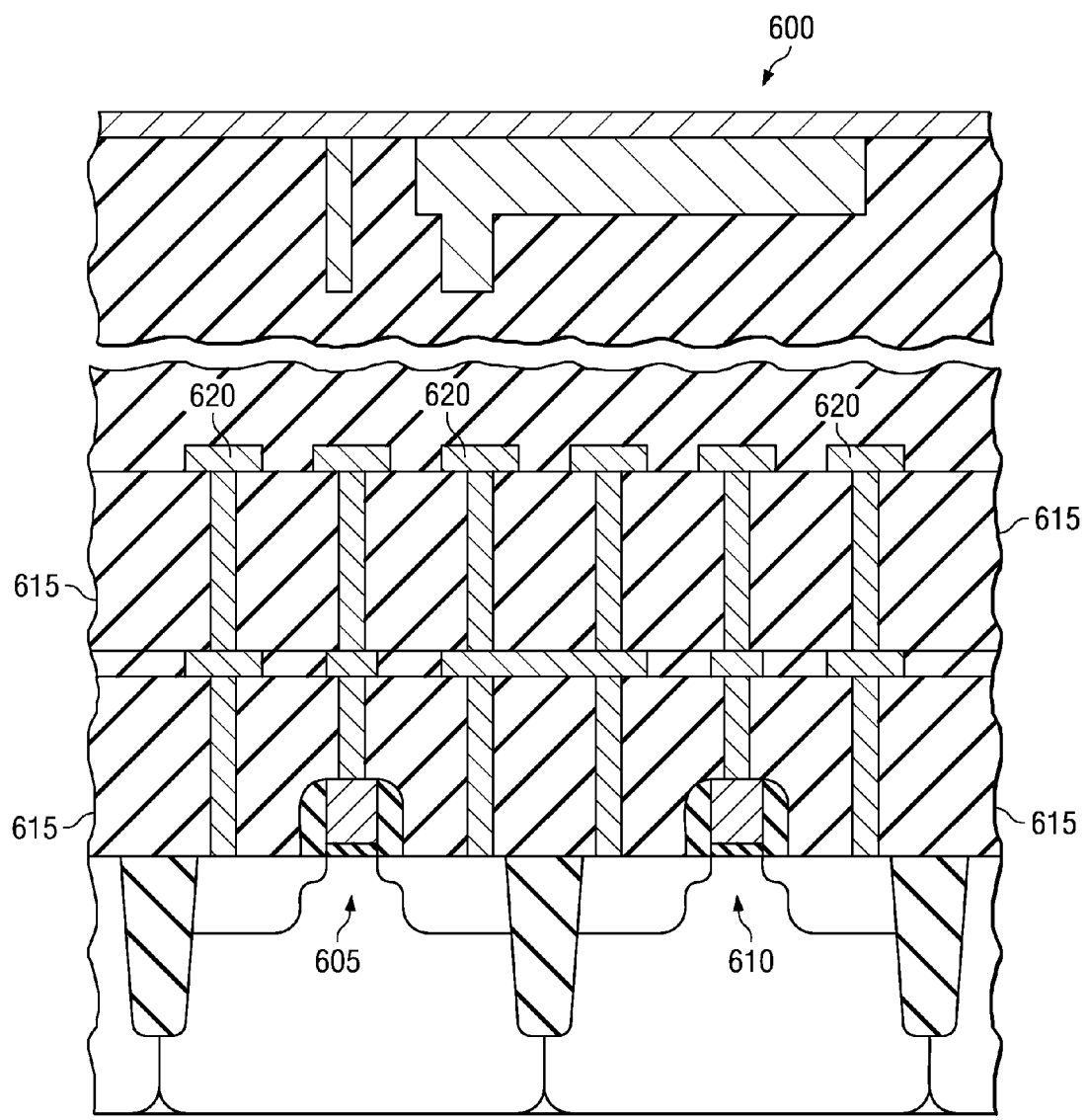
FIG. 6 illustrates the semiconductor device of FIG. 5 incorporated into an integrated circuit (IC).

FIG. 6 illustrates the device 100 configured as or incorporated into an integrated circuit (IC) 600. The IC 600 includes device 100 manufactured in a manner as discussed above and configured as complementary transistors 605 and 610. Dielectric layers 615, which may be formed using conventional processes and materials, are located over the transistors 605 and 610 and interconnects 620, which may be conventional interconnects, such as damascene or dual damascene both of which are illustrated, are formed over and within the dielectric layers 615. The interconnects 620 connect other circuit components in the IC 600. Those who are skilled in the art would understand how to incorporate the device 100 into the IC 600.

Those skilled in the art will appreciate that other and further additions, deletions, substitutions and modifications may be made to the described embodiments without departing from the scope the disclosure set forth herein.

What is claimed is:

1. A method of manufacturing a semiconductor device, comprising:
   forming gate structures over a semiconductor substrate, including forming gate electrodes and spacers adjacent the gate electrodes;
   forming source/drains adjacent the gate structures;
   forming a laminated stress layer over the gate structures and the semiconductor substrate, including cycling a deposition process to form a first stress layer over the gate electrodes and the semiconductor substrate and at least a second stress layer over the first stress layer; and
   annealing the laminated stress layer at a temperature of about 900° C. or greater;
   wherein cycling the deposition process includes pausing the deposition between the formation of the at least first and second stress layers for a period of time ranging from about 5 sec to about 5 minutes.

2. The method recited in claim 1, wherein a height to gap ratio between electrode structures ranges from about 0.9 to about 1.5.

3. The method recited in claim 1, wherein the first and at least second stress layers are formed by chemical vapor deposition and by flowing $SiH_4$ at a flow rate ranging from about 50 sccm to about 700 sccm and $N_2$ or $NH_3$ at a flow rate ranging from about 500 sccm to about 6000 sccm, and at a pressure ranging from about 1 torr to about 50 torr and a temperature ranging from about 300° C. to about 500° C.

4. The method recited in claim 1, wherein the annealing is performed using a thermal anneal, a laser anneal, or a combination thereof.

5. The method recited in claim 1, wherein forming the laminated stress layer includes forming at least a third stress layer over the second stress layer and wherein a thickness of each of the at least first, second, and third stress layers is at least about 100 angstroms.

6. A method of manufacturing a semiconductor device, comprising:
   forming gate structures over a semiconductor substrate, including forming gate electrodes and spacers adjacent the gate electrodes;
   forming source/drains adjacent the gate structures;
   forming a laminated stress layer over the gate structures and the semiconductor substrate, including cycling a deposition process to form a first stress layer over the gate electrodes and the semiconductor substrate and at least a second stress layer over the first stress layer; and
   annealing the laminated stress layer at a temperature of about 900° C. or greater;
   wherein the first and at least second stress layers are silicon-rich nitride layers and are formed by plasma enhanced chemical vapor deposition by flowing $SiH_4$ at a rate ranging from about 15 sccm to about 200 sccm and flowing $N_2$ at a rate ranging from about 5000 sccm to about 15000 sccm, flowing $NH_3$ at a rate ranging from about 50 sccm to about 150 sccm, and at a pressure ranging from about 7 torr to about 50 torr, a temperature ranging from about 350° C. to about 450° C. and at a power ranging from about 10 watts to about 200 watts.

7. The method recited in claim 6, wherein annealing includes annealing with ultra violet light.

8. The method recited in claim 7, wherein the annealing includes conducting a thermal anneal, a laser anneal or a combination thereof subsequent to annealing with the ultra violet light.

9. A method of manufacturing a semiconductor device, comprising:
  forming gate structures over a semiconductor substrate, including forming gate electrodes and forming spacers adjacent the gate electrodes;
  forming source/drains adjacent the gate structures;
  forming a laminated silicon nitride stress layer over the gate electrodes and the source/drains, including:
    depositing a first silicon nitride stress layer over the gate electrodes and the semiconductor substrate;
    pausing the deposition process a first time;
    depositing a second silicon nitride stress layer over the first silicon nitride stress layer subsequent to pausing the first time;
    pausing the deposition process a second time subsequent to depositing the second silicon nitride stress layer; and
    depositing a third silicon nitride stress layer over the second silicon nitride stress layer; and
  annealing the laminated silicon nitride stress layer at a temperature ranging from about 900° C. to about 1300° C. with a thermal anneal, a laser anneal, or a combination thereof.

10. The method recited in claim 9, wherein a height to gap ratio between electrodes ranges from about 0.9 to about 1.5.

11. The method recited in claim 9, wherein the first and second silicon nitride stress layers are formed by chemical vapor deposition by flowing $SiH_4$ at a rate ranging from about 50 sccm to about 700 sccm and flowing $N_2$ or $NH_3$ at a rate ranging from about 500 sccm to about 6000 sccm, at a pressure ranging from about 1 torr to about 50 torr and a temperature ranging from about 300° C. to about 500° C.

12. The method recited in claim 9, wherein the semiconductor device is an integrated circuit and annealing activates dopants located within the source/drains and the method further includes removing the laminated silicon stress layer and forming dielectric layers over the gate electrodes and forming interconnects within and over the dielectric layers to interconnect the gate electrodes.

13. A method of manufacturing a semiconductor device, comprising:
  forming gate structures over a semiconductor substrate, including forming gate electrodes and forming spacers adjacent the gate electrodes;
  forming source/drains adjacent the gate structures;
  forming a laminated silicon nitride stress layer over the gate electrodes and the source/drains, including:
    depositing a first silicon nitride stress layer over the gate electrodes and the semiconductor substrate;
    pausing the deposition process a first time; and
    depositing at least a second silicon nitride stress layer over the first silicon nitride stress layer subsequent to pausing; and
  annealing the laminated silicon nitride stress layer at a temperature ranging from about 900° C. to about 1300° C. with a thermal anneal, a laser anneal, or a combination thereof;
  wherein pausing the deposition process the first time includes pausing the deposition process for a period of time ranging from about 5 sec to about 5 minutes.

14. A method of manufacturing a semiconductor device, comprising:
  forming gate structures over a semiconductor substrate, including forming gate electrodes and forming spacers adjacent the gate electrodes;
  forming source/drains adjacent the gate structures;
  forming a laminated silicon nitride stress layer over the gate electrodes and the source/drains, including:
    depositing a first silicon nitride stress layer over the gate electrodes and the semiconductor substrate;
    pausing the deposition process a first time; and
    depositing at least a second silicon nitride stress layer over the first silicon nitride stress layer subsequent to pausing; and
  annealing the laminated silicon nitride stress layer at a temperature ranging from about 900° C. to about 1300° C. with a thermal anneal, a laser anneal, or a combination thereof;
  wherein the first and at least second silicon nitride stress layers are silicon-rich nitride layers and are formed by plasma enhanced chemical vapor deposition and by flowing $SiH_4$ at a rate ranging from about 15 sccm to about 200 sccm and flowing $N_2$ at a rate ranging from about 5000 sccm to about 15000 sccm, flowing $NH_3$ at a rate ranging from about 50 sccm to about 150 sccm, and at a pressure ranging from about 7 torr to about 50 torr, a temperature ranging from about 350° C to about 450° C. and at a power ranging from about 10 watts to about 200 watts.

15. The method recited in claim 14, wherein annealing includes annealing with ultra violet (UV) light and annealing with the thermal anneal, a laser anneal, or a combination thereof subsequent to annealing with the UV light.

* * * * *